United States Patent
Lee et al.

(10) Patent No.: US 10,666,280 B2
(45) Date of Patent: May 26, 2020

(54) RADIATION-HARDENED ANALOG-TO-DIGITAL CONVERTER CIRCUIT, DIGITAL SIGNAL CALIBRATION METHOD THEREOF, AND RECORDING MEDIUM FOR PERFORMING THE METHOD

(71) Applicant: KOREA UNIVERSITY RESEARCH AND BUSINESS FOUNDATION, Seoul (KR)

(72) Inventors: Hyung-Min Lee, Seoul (KR); Duckhoon Ro, Seoul (KR); Kyung-Soo Jeong, Seoul (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 0 days.

(21) Appl. No.: 16/363,316

(22) Filed: Mar. 25, 2019

(65) Prior Publication Data
US 2019/0319632 A1    Oct. 17, 2019

(30) Foreign Application Priority Data
Apr. 12, 2018    (KR) .................... 10-2018-0042945

(51) Int. Cl.
*H03M 1/10*    (2006.01)
*H03M 1/06*    (2006.01)

(52) U.S. Cl.
CPC ....... *H03M 1/1023* (2013.01); *H03M 1/0607* (2013.01)

(58) Field of Classification Search
CPC ............. H03M 1/1023; H03M 1/0607; H03M 1/1061; H03M 1/46; H03M 1/785; H03K 19/00338
USPC .................................................. 341/118, 155
See application file for complete search history.

(56) References Cited

U.S. PATENT DOCUMENTS 8,598,534 B2 *  12/2013  Solf ........................ G01T 1/249
                                                          250/363.02
10,396,812 B2 *  8/2019  Kwon ................. H03M 1/0682

FOREIGN PATENT DOCUMENTS

KR    10-2011-0040499 A    4/2011
KR    10-2017-0100410 A    9/2017

* cited by examiner

*Primary Examiner* — Brian K Young
(74) *Attorney, Agent, or Firm* — Hauptman Ham, LLP

(57) ABSTRACT

The present disclosure relates to a radiation-hardened analog-to-digital converter circuit and its digital signal calibration method capable of efficiently compensating for an external influence or a changed semiconductor element performance, and a recording medium for performing the method.

10 Claims, 15 Drawing Sheets

RADIATION-HARDENED ANALOG-TO-DIGITAL CONVERTER CIRCUIT, DIGITAL SIGNAL CALIBRATION METHOD THEREOF, AND RECORDING MEDIUM FOR PERFORMING THE METHOD

CROSS-REFERENCE TO RELATED APPLICATIONS

This application claims priority under 35 U.S.C. § 119 to Korean Patent Application No. 10-2018-0042945, filed on Apr. 12, 2018, in the Korean Intellectual Property Office, the disclosure of which is incorporated herein by reference in its entirety.

TECHNICAL FIELD

The present disclosure relates to a radiation-hardened analog-to-digital converter circuit, a digital signal calibration method thereof, and a recording medium for performing the method, and more particularly, to a radiation-hardened analog-to-digital converter circuit and its digital signal calibration method capable of efficiently compensating for an external influence or a changed semiconductor element performance, and a recording medium for performing the method.

BACKGROUND

An automated system generally detects and processes various signals, controls the corresponding system based on the results, and notifies a state of the corresponding system to a manager or the like as necessary.

A representative device used in the automated system is a data collection device, which may continuously measure various signal (physical quantity) changes and process various kinds of data.

In addition, since the data collection device includes a plurality of channels to receive various kinds of data from various devices, the data collection device is widely used in data collection and processing fields.

The data collection device may convert the detected analog signal into a digital signal, process the digital signal, and transmit the processed signal to another device through a data communication line.

In order to transmit the data collected by the data collection device to another device, the data collection device converts the collected analog signals into digital signals, processes the digital signals, and transmits the processed digital signals to another device.

However, errors may occur in converting an analog signal to a digital signal or converting a digital signal to an analog signal.

These errors are caused by a deviation of hardware component values in the data collection device, and it is necessary to calibrate the errors in order for the data collection device to transmit an accurate signal.

RELATED LITERATURES

Patent Literature (Patent Literature 1) Korean Unexamined Patent Publication No. 10-2011-0040499

(Patent Literature 2) Korean Unexamined Patent Publication No. 10-2017-0100410

SUMMARY

The present disclosure is directed to providing a radiation-hardened analog-to-digital converter circuit, which may be robust to a single event effect (SEE) by using several switched-capacitors, compensate for the performance changed due to a total ionized dose (TID) effect by using a semiconductor element, calculate an offset by the TID effect by using an external reference voltage, and eliminate the offset; a digital signal calibration method thereof; and a recording medium for performing the method.

The technical subject of the present disclosure is not limited to the above, and other technical subjects not mentioned herein may be clearly understood by those skilled in the art from the following disclosure.

In one aspect of the present disclosure, there is provided a radiation-hardened analog-to-digital converter circuit, comprising: a sample-and-hold circuit having a plurality of switched-capacitors configured to perform a switching operation corresponding to a sample phase or a hold phase so as to reduce an influence by a single event effect; a comparator circuit in which a comparator of a first stage is modeled as a variable resistor to compensate for circuit performance that is changed according to a total ionized dose effect, the comparator circuit having a non-inverting input terminal (+ terminal) to which the sample-and-hold circuit is connected; and a resistance-based digital-to-analog converter connected between an inverting input terminal (− terminal) of the comparator circuit and a successive approximation register logic in series to calculate an offset of the comparator caused by the total ionized dose effect through an external reference voltage and remove the calculated offset through a calibration resistor.

In an embodiment, the sample-and-hold circuit may include: a first capacitor connected to an input ($V_{in}$) and output ($V_{out}$) in parallel; a second capacitor connected to the input ($V_{in}$), the output ($V_{out}$) and the first capacitor in parallel; a first switch connected between the first capacitor and the ground in series to perform a switching operation; a second switch connected between the second capacitor and the ground in series to perform a switching operation; and a third switch connected between the input ($V_{in}$) and the output ($V_{out}$) in series to perform a switching operation.

In an embodiment, in case of a sample phase, the sample-and-hold circuit may switch on (ON) the first switch, the second switch and the third switch so that the first capacitor and the second capacitor are charged simultaneously. In an embodiment, in case of a hold phase, the sample-and-hold circuit may switch off (OFF) the first switch and the second switch simultaneously so that the first capacitor and the second capacitor come into a floating state, and then switch off the third switch.

In an embodiment, in case of the hold phase, the sample-and-hold circuit may switch on the second switch before the comparator circuit operates in a compare phase, and then switch off the second switch so that the influence caused by the single event effect generated at the output ($V_{out}$) is compensated.

In an embodiment, in case of the hold phase, the sample-and-hold circuit may switch on the first switch after switching on and off the second switch so that the influence caused by the single event effect generated at the output ($V_{out}$) is additionally compensated.

In an embodiment, the comparator circuit may include: a first variable resistor connected to a first output voltage ($V_{out1}$) in series to receive a first differential input signal ($V_{inp}$); a second variable resistor connected to the first variable resistor in parallel and connected to a second output voltage ($V_{out2}$) in series to receive a second differential input signal ($V_{inn}$); a third variable resistor connected to the first variable resistor and the second variable resistor in series to receive a clock (CLK) signal; and a fourth variable resistor connected to the third variable resistor in series to control a gate voltage through a total ionized dose (TID) monitor.

In an embodiment, the fourth variable resistor may compensate for resistances of the first variable resistor, the second variable resistor and the third variable resistor by controlling the gate voltage through the total ionized dose monitor so that the resistances measured at the first output voltage ($V_{out1}$) and the second output voltage ($V_{out2}$) are maintained consistently.

In another aspect of the present disclosure, there is also provided a digital signal calibration method of a radiation-hardened analog-to-digital converter circuit, comprising: checking offset influence of a sample-and-hold circuit and a comparator circuit by a total ionized dose by applying a predetermined reference voltage to an input of an analog-to-digital converter circuit; primarily calibrating an output digital signal of the analog-to-digital converter circuit through a post processing at the outside by using the checked offset influence; and secondarily calibrating the primarily calibrated output digital signal at the inside of the analog-to-digital converter circuit through digital-to-analog converter (DAC) calibration at a resistance-based digital-to-analog converter.

In an embodiment, in the secondarily calibrating step, the resistance-based digital-to-analog converter may make an artificial offset as much as an internal offset voltage of the analog-to-digital converter circuit, which is checked in advance through an additional calibration resistor, so that the offset caused by the total ionized dose is removed.

In another aspect of the present disclosure, there is also provided a computer-readable recording medium, in which a computer program for performing the digital signal calibration method of a radiation-hardened analog-to-digital converter circuit is recorded.

According to one aspect of the present disclosure described above, it is possible to develop a stable analog-to-digital converter (ADC) circuit, which may maximize the radiation-hardened characteristics and life span of essential electronic components exposed to harsh radiation environments, significantly reduce the economic cost for system maintenance, improve the accuracy of the system control technology, and be universally used in various radiation environments.

DETAILED DESCRIPTION OF EMBODIMENTS

Figure 1:
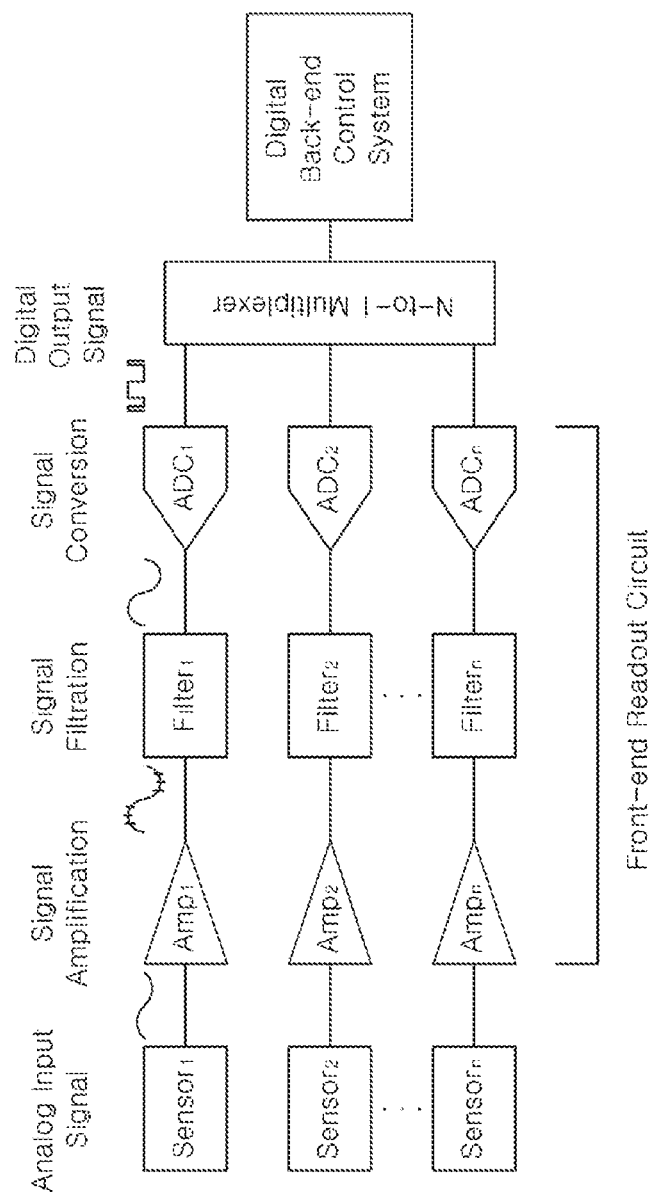
FIG. 1 is a diagram for illustrating a front-end readout circuit structure.

The present disclosure will be described in detail with reference to the accompanying drawings which illustrate, by way of example, specific embodiments in which the present disclosure may be implemented. These embodiments are described in sufficient detail to enable those skilled in the art to implement the present disclosure. It should be understood that various embodiments of the present disclosure are different from each other but need not be mutually exclusive. For example, specific features, structures and characteristics described herein may be implemented in other embodiments without departing from the scope of the present disclosure in connection with one embodiment. It should also be understood that the position or arrangement of individual components in each embodiment may be varied without departing from the scope of the present disclosure. Therefore, the following detailed description is not taken to limit the present disclosure, and the scope of the present disclosure is limited only by the appended claims, along with the full scope of equivalents to which such claims are entitled. In the drawings, like reference signs refer to the same or similar functions throughout several aspects.

Hereinafter, preferred embodiments of the present disclosure will be described in more detail with reference to the drawings.

For a stable and effective control system, it is essential to precisely control the system by measuring sensor signals such as temperature, pressure and electromagnetic field. FIG. 1 shows a sensor front-end readout circuit structure, which measures and amplifies analog signals in the control system, filters unnecessary noise signals, and then converts the analog signals into digital signals.

The output of the analog-to-digital converter (ADC) circuit of FIG. 1 is a digital signal, which has a more robust characteristic compared to an analog signal. Thus, the amplifier and the ADC for amplifying and converting the analog signals are important.

In particular, the ADC circuit for precisely measuring various sensor analog signals and converting into digital signals is an essential electronic component that directly determines the accuracy and reliability of the control system.

If the ADC circuit is not able to deliver a correct measurement signal to the control system due to various external influences, it is obvious that the system is not properly controlled, which seriously affects not only the accuracy and efficiency of the control system but also the stability of the system.

The ADC circuit includes analog circuits sensitive to the change of characteristics and its performance may be easily changed depending on external influences such as temperature, process change, or radiation. In particular, the change of characteristics of the circuit due to the radiation effect is a big problem in the control system.

Representative radiation environments include nuclear, cosmic radiation, nuclear fusion reactor, and the like, and the ADC circuit is an electronic component that is directly exposed to the radiation environments.

Among them, the nuclear fusion reactor will be described in detail as an example. A Tokamak nuclear fusion reactor of ITER (the International Thermonuclear Experimental Reactor), which is designed with a machine weight of 23,000 tons and a plasma temperature of up to 150 million degrees for a power generation capacity of 500 MW, generates neutrons and gamma rays up to 10 times higher than JET (Joint European Torus) and provides a very harsh diagnostic environment with a long pulse length of up to 100 times.

The radiation exposure environment of the ITER nuclear fusion reactor has a high dose rate of about 30 kGy/h based on the gamma ray and the total ionized dose is over 100 MGy.

Thus, the influence of the radiation may change electrical characteristics of a semiconductor device, which may cause harsh performance degradation, malfunction and shutdown of the main function of an ADC circuit located in the nuclear fusion reactor.

In addition, it is necessary to periodically replace electronic components with degraded performance due to the cumulated radiation influence, which is a considerable economic burden for maintenance of the nuclear fusion reactor.

Figure 2A:
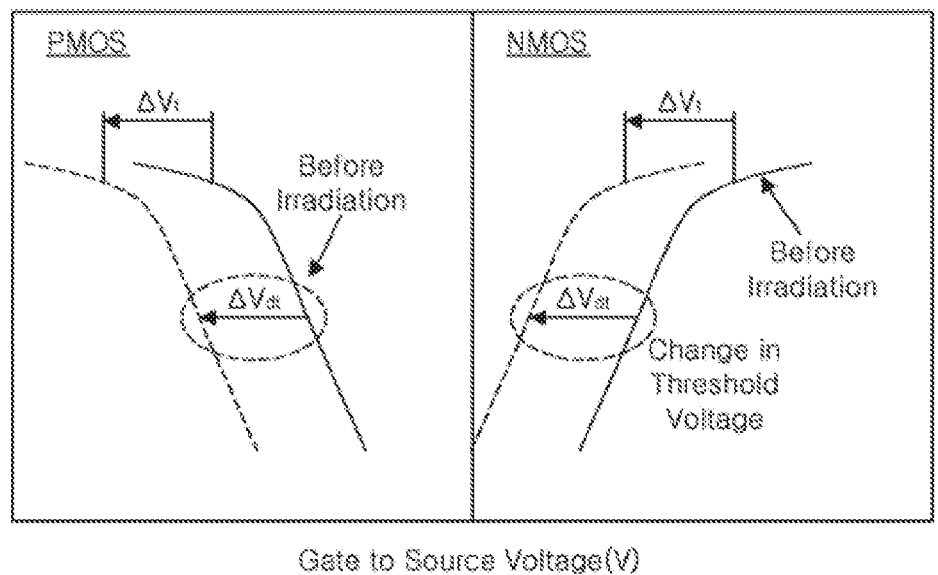
FIGS. 2A to 2C are graphs for illustrating the change of performance of a CMOS transistor in an integrated circuit according to a radiation effect.
Figure 2B:
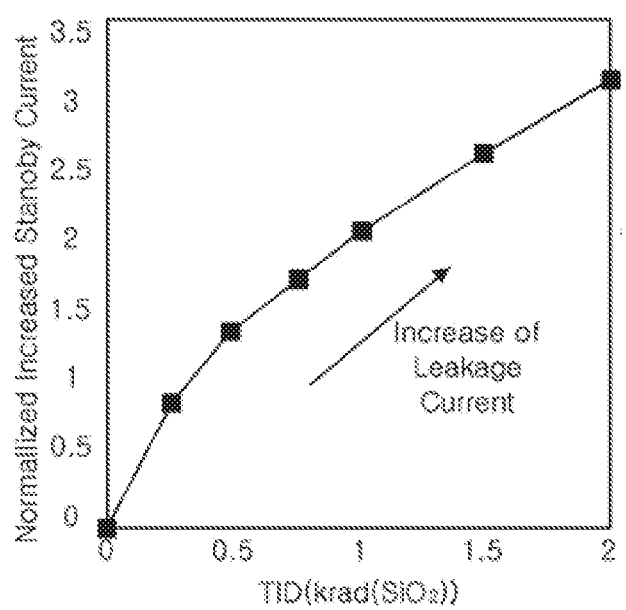
Figure 2C:
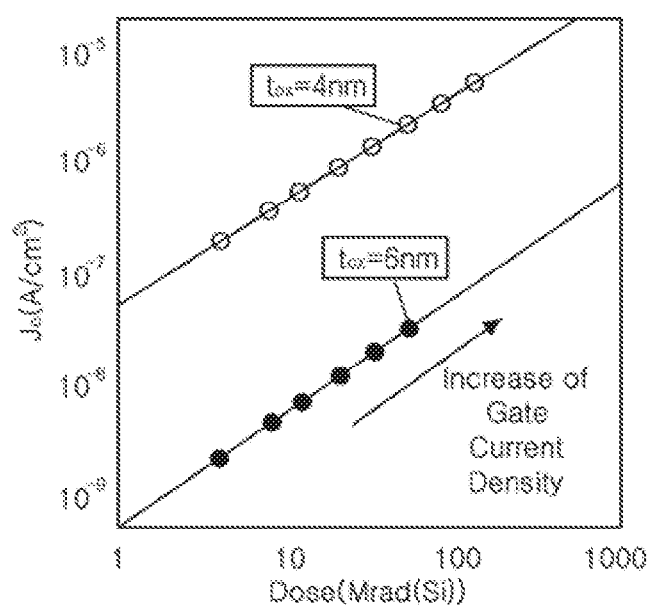

The influence of high energy particles such as neutrons or gamma rays generated in the nuclear fusion reactor environment on the elements in the integrated circuit may be briefly classified into a total ionized dose (TID) effect, a single event effect (SEE) and a displacement damage (DD) effect. Examples of performance degradation of the analog circuit due to the radiation effects may be found in FIGS. 2A to 2C.

In case of the TID, charge particles penetrate an element to form an electron-hole pair, which causes additional holes to trap in a gate oxide film and accumulate to change the threshold voltage of the semiconductor device. Here, because the threshold voltage is changed gradually, the TID gives a small influence on the digital circuit but gives a great influence on the analog circuit.

In case of the SEE, high energy particles such as neutrons instantaneously collide with an integrated circuit element to generate a voltage change. Thus, the SEE gives a less influence on the analog circuit through which a bias voltage or current flows but gives a great influence on the digital circuit through which a bias voltage or current does not flow.

The DD is generated because silicon atoms of a semiconductor are separated from the crystal lattice due to high energy particles to increase a leakage current. The DD gives a small influence on the complementary metal-oxide semiconductor (CMOS) but gives a great influence on the bipolar junction transfer (BJT) and the diode.

Thus, it is essential to study the design technique of an ADC circuit having radiation-hardened characteristics for all of TID, SEE and DD effects and the calibration technique for compensating for performance degradation.

Figure 3:
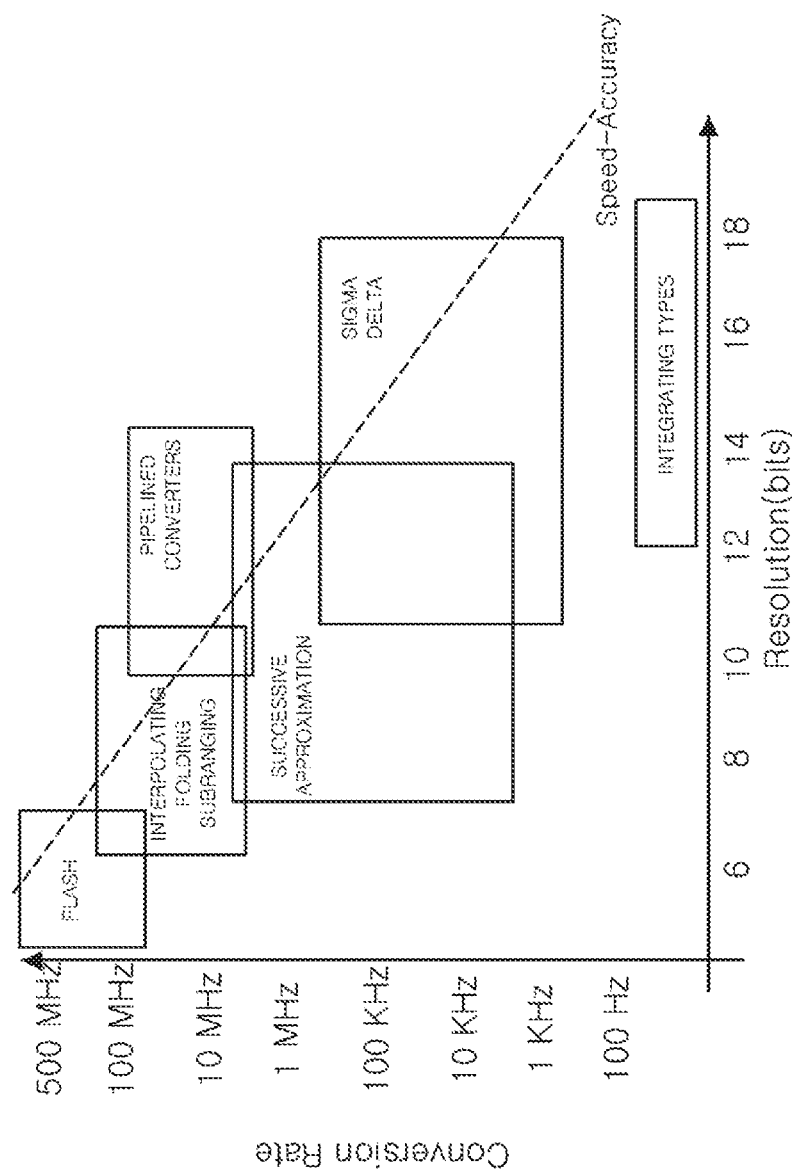
FIG. 3 is a graph for illustrating the relationship of a resolution and a sampling rate of ADC structures.

There are various types of ADC such as flash ADC, pipelined ADC, SAR ADC, and sigma-delta ADC, and these ADCs may be classified as shown in FIG. 3 depending on a desired resolution and a desired sampling rate.

Considering a magnetic field sensor used in the nuclear fusion reactor diagnosis control system as an example, the performance of the ADC demands a resolution of 10 bits and a sampling rate of 20 kS/s.

Thus, the flash ADC with a maximum resolution of about 6 bits is not available. Also, since the flash ADC uses a lot of comparators, the performance may be greatly degraded by the TID.

The resolution of the pipelined ADC is satisfactory, but since it uses a lot of operation amplifiers and comparators, similar to the flash ADC, the performance may be significantly degraded by the TID.

The flash ADC and the pipelined ADC are not suitable for use in harsh diagnostic environments such as the ITER nuclear fusion reactor because the performance may be significantly degraded by the TID, even though they are robust to the SEE due to less use of digital circuits that are vulnerable to SEE.

A successive approximation register (SAR) ADC may implement a resolution of 10 bits or more, and a sub-block circuit for implementing the SAR ADC may be designed using a digital circuit. Thus, the SAR ADC is robust to the TID, compared to the flash ADC and the pipelined ADC.

In addition, since the SAR ADC still uses a digital circuit such as a flip-flop, it is more vulnerable to the SEE, compared to the flash ADC and the pipelined ADC. However, this problem may be solved by using a triple modular redundancy (TMR) method in which three digital circuits are overlapped and their outputs are compared to select two or more identical outputs.

The sigma-delta ADC has a high resolution, but its performance may be significantly degraded by the TID since a lot of operation amplifiers are used. Also, the sigma-delta ADC is more vulnerable to the SEE since it uses more switched-capacitors and flip-flops than the SAR ADC.

TABLE 1

| ADC | Flash | Pipeline | SAR | Sigma-Delta |
|---|---|---|---|---|
| Resolution | − | + | + | ++ |
| TID Tolerant | − − (multipel comparators) | − − (multipel op-amps) | + (digitally-assisted) | − (a few op-amps) |
| SEE Tolerant | ++ (No flip-flop) | ++ (No flip-flop) | + (few cap & flip-flop) | − (more cap & flip-flop) |

Table 1 shows characteristic analysis of the resolution, TID tolerance and SEE tolerance of various ADC structures.

Seeing the table, it may be understood that the SAR ADC may meet the performance of 10-bit resolution and 20 kS/s sampling rate, which are required in a general sensor control system, and may be designed to be robust to both the TID and the SEE. However, the performance of the SAR ADC may still be degraded due to the influence of the TID and the SEE.

Therefore, the present disclosure is directed to providing a circuit design technique capable of further improving the radiation-hardened performance of the SAR ADC.

Figure 4:
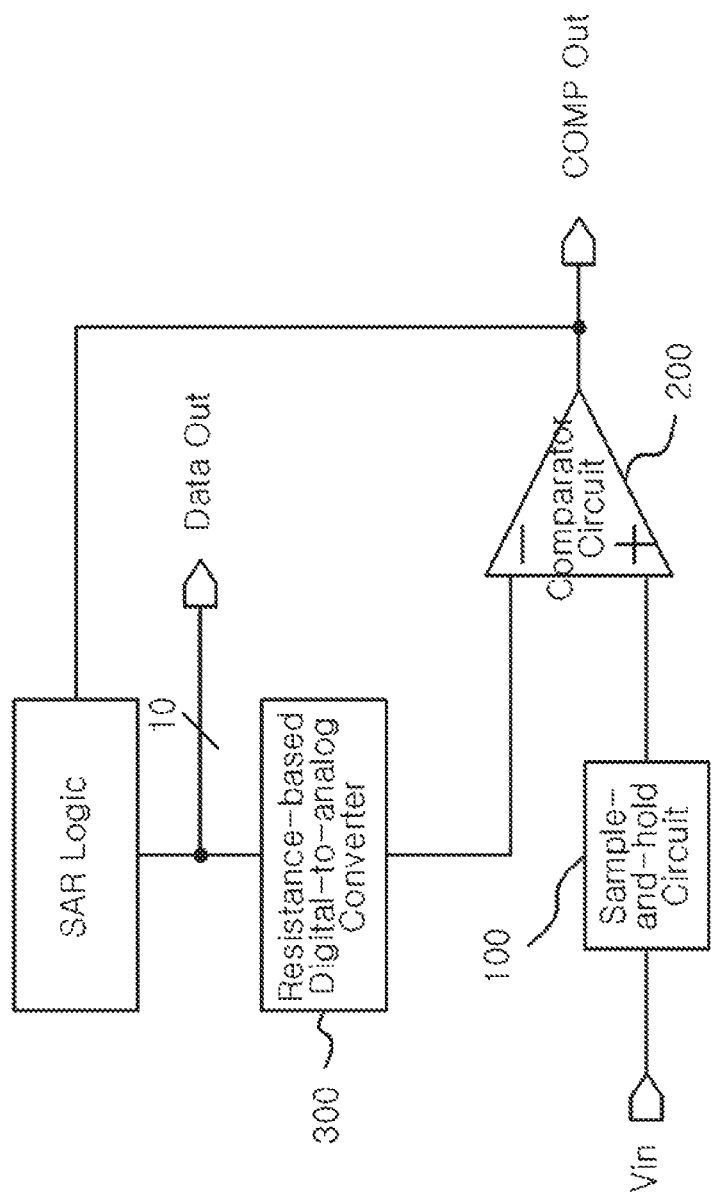
FIG. 4 is a diagram for illustrating a radiation-hardened analog-to-digital converter circuit according to an embodiment of the present disclosure.

FIG. 4 is a diagram for illustrating a radiation-hardened analog-to-digital converter circuit according to an embodiment of the present disclosure.

Referring to FIG. 4, the radiation-hardened analog-to-digital converter circuit includes a sample-and-hold circuit 100, a comparator circuit 200, and a resistance-based digital-to-analog converter 300, and exhibits a SAR ADC circuit structure.

In the present disclosure, binary searches are performed successively. In the SAR logic, the most significant bit (MSB) is initialized to 1 and the remainders are initialized to 0, so that the voltage input to a (−) terminal of the comparator circuit 200 (−) through the resistance-based digital-to-analog converter 300 is ($\frac{1}{2}$)$v_{ref}$ that is a half of the reference voltage.

If the voltage input to the input ($v_{in}$) is greater than ($\frac{1}{2}$)$v_{ref}$, the MSB is maintained as 1, and if the voltage is smaller an ($\frac{1}{2}$)$v_{ref}$, the MSB is changed into 0. Simultaneously with determining the MSB, the next bit is made into 1 and compared with the input voltage ($v_{in}$) again to obtain the corresponding bit.

Through this process, the least significant bit (LSB) is obtained, and if the LSB is obtained, all bits are output.

In the present disclosure, in order to design the TID and the SEE more robustly, as shown in FIG. 4, the followings are applied to the sample-and-hold circuit (S/H) 100, the comparator circuit (COMP) 200 and the resistance-based digital-to-analog converter (R2R DAC) 300.

The sample-and-hold circuit 100 is connected between the input ($v_{in}$) and a non-inverting input terminal (+ terminal) of the comparator circuit 200 in series, and a plurality of switched-capacitors performs a switching operation corresponding to a sample phase or a hold phase so that the influence caused by the single event effect may be reduced.

That is, the sample-and-hold circuit 100 is designed to be robust to the SEE by using several switched-capacitors.

The comparator circuit 200 has the non-inverting input terminal (+ terminal) to which the sample-and-hold circuit 100 is connected, and models a comparator of a first stage with a variable resistor to calibrate the circuit performance, which is changed due to the total ionized dose effect.

That is, the comparator circuit 200 may add a semiconductor element and calibrate the performance that varies depending on the total ionized dose (TID) effect.

The resistance-based digital-to-analog converter 300 is connected between an inverting input terminal (− terminal) of the comparator circuit 200 and the successive approximation register logic in series, calculates an offset of the comparator caused by the total ionized dose effect through an external reference voltage, and removes the calculated offset through a calibration resistor.

That is, the resistance-based digital-to-analog converter 300 may calculate the offset of the comparator circuit 200 caused by the TID effect through the external reference voltage and remove the offset.

The study on radiation-hardened electronic components and diagnostic control systems has been performed mainly through the process development and the shielding technology, and the study on radiation-hardened components through a circuit design is weak. The existing technologies for radiation-hardened electronic components are also mainly about shielding and processing, and some circuit designing techniques are for digital logic circuits and there are few techniques for analog circuit design.

At the present, there is a technique for analog circuit, especially ADC, but it is different from the ADC circuit design technology invented as ADC using time interleaving.

In case of time interleaving, the interior of the ADC circuit is not designed to be robust to radiation, but rather to be robust to radiation on average by using a plurality of ADC units that are operated in parallel, which different from the present disclosure in which the interior of the ADC circuit is designed to be robust to radiation.

In addition, the existing technologies mainly relate to radiation-hardened research (radiation below 1 MGy) for electronic components used in nuclear power plants, space components, x-ray and so on. However, since the radiation-hardened circuit may be exposed to even more harsh radiation environments such as nuclear fusion reactors (radiation over 100 MGy), it is needed to study a radiation-hardened circuit design technique that is optimized for the harsh radiation environments.

To this end, the present disclosure provides an ADC circuit design technique that is robust even in harsh radiation environments, which improves the accuracy of diagnostic control in radiation environments and also improves the operational stability and life span of core electronic components.

The ADC provided in the present disclosure is a SAR ADC radiation-hardened circuit design technique that may meet a high resolution of 10 bits or more and a sampling rate of several kS/s to several ten MS/s, which is suitable for general sensor measurement.

By doing so, the radiation-hardened characteristics and life span of core electronic components exposed to harsh radiation environments may be maximized, and the economic costs for system maintenance may be greatly reduced.

In addition, it is possible to improve the accuracy of the system control technology and develop a stable ADC that may be universally used in various radiation environments, which will contribute greatly to securing the technology related to domestic diagnostic control devices and core electronic components.

FIGS. 5A to 7B are diagrams for illustrating a sample-and-hold circuit depicted in FIG. 4.

Figure 5A:
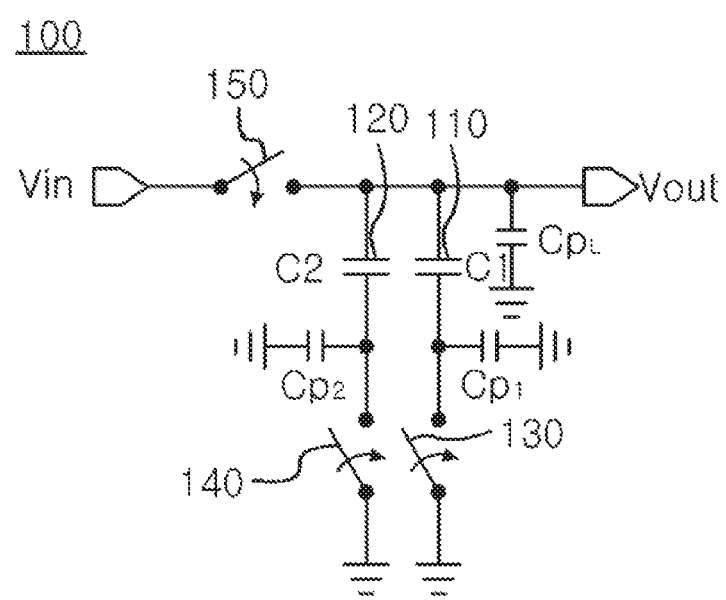
FIGS. 5A to 7B are diagrams for illustrating a sample-and-hold circuit depicted in FIG. 4.

Referring to FIG. 5A, the sample-and-hold circuit 100 includes a first capacitor 110, a second capacitor 120, a first switch 130, a second switch 140, and a third switch 150.

The sample-and-hold circuit 100 is the only circuit using a switched-capacitor (where a capacitor is driven by a switch operation) among the circuits according to the present disclosure, and the voltage value stored in the capacitor may be arbitrarily changed by the SEE.

In order to reduce any variation, it is possible to minimize the change of the voltage value by the SEE by using a large capacitor, but this increases a circuit area, which raises the price of the electronic component.

Accordingly, in the present disclosure, instead of using only one capacitor as in the existing technique, the capacitor is divided into two capacitors (for example, (the first capacitor 110 and the second capacitor 120, the total capacitance is identical), and their operation timings are adjusted to implement a S-H circuit robust to the SEE.

The first capacitor 110 is connected to the input ($V_{in}$), the output ($V_{out}$) and the second capacitor 120 in parallel, has a parasitic capacitance ($C_{P_1}$), and switches on (ON) or off (OFF) with the ground by the first switch 130.

The second capacitor 120 is connected to the input ($V_{in}$), the output ($V_{out}$) the first capacitor 110 in parallel, has a parasitic capacitance ($C_{P_2}$), and switches on or off with the ground by the second switch 140.

The first switch 130 is connected between the first capacitor 110 and the ground in series to perform a switching operation.

The second switch 140 is connected between the second capacitor 120 and the ground in series to perform a switching operation.

The third switch 150 is connected between the input ($V_{in}$) and the output ($V_{out}$) in series to perform a switching operation so that a current or voltage flowing into the circuit is controlled.

Figure 5B:
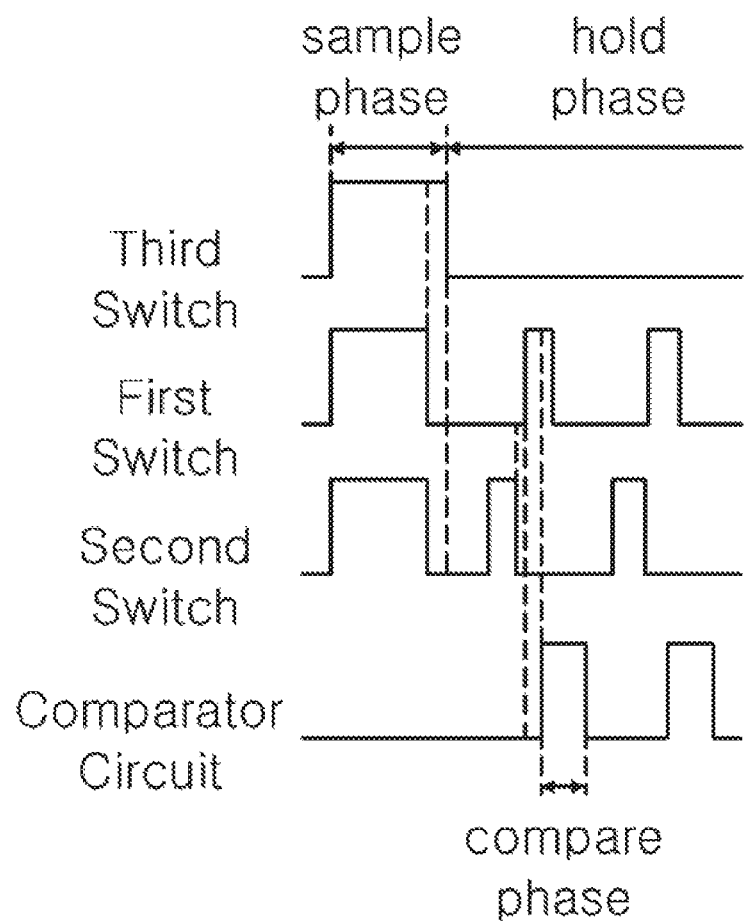

FIG. 5B is a diagram showing a clock waveform of the sample-and-hold circuit 100.

Referring to FIG. 5B, in case of a sample phase, the sample-and-hold circuit 100 may switch on (ON) the first switch 130, the second switch 140 and the third switch 150 so that the first capacitor 110 and the second capacitor 120 may be charged simultaneously.

Also, in case of a hold phase, the sample-and-hold circuit 100 may switch off (OFF) the first switch 130 and the second switch 140 simultaneously so that the first capacitor 110 and the second capacitor 120 come into a floating state, and then switch off the third switch 150.

At this time, in the case of the hold phase, the sample-and-hold circuit 100 switches on the second switch 140 before the comparator circuit 200 operates in a compare phase, and then switches off the second switch 140 so that the influence caused by the single event effect generated at the output ($V_{out}$) may be calibrated.

In addition, in the case of the hold phase, after switching on and off the second switch 140, the sample-and-hold circuit 100 switches on the first switch 130 so that the influence caused by the single event effect generated at the output ($V_{out}$) may be additionally calibrated.

If the comparator circuit 200 turns on the compare clock, the comparison is performed for a very short time. Thus, after the compare clock is turned on, the first switch 130 is turned off, and the process is repeated.

Figure 6A:
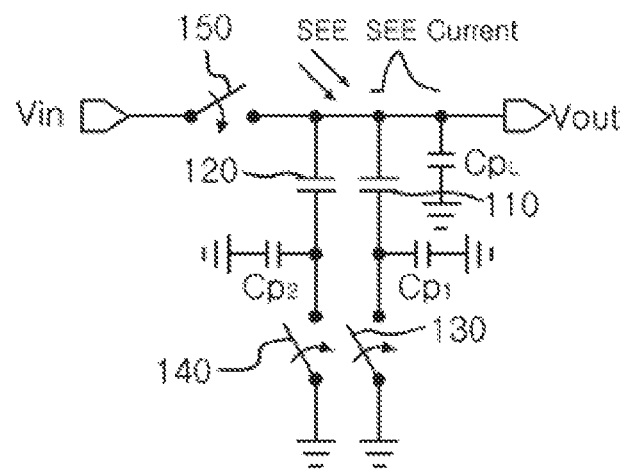
Figure 6B:
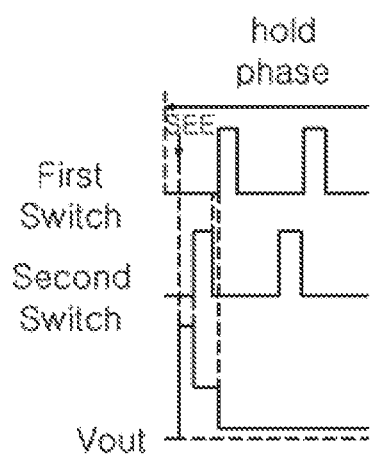
Figure 7A:
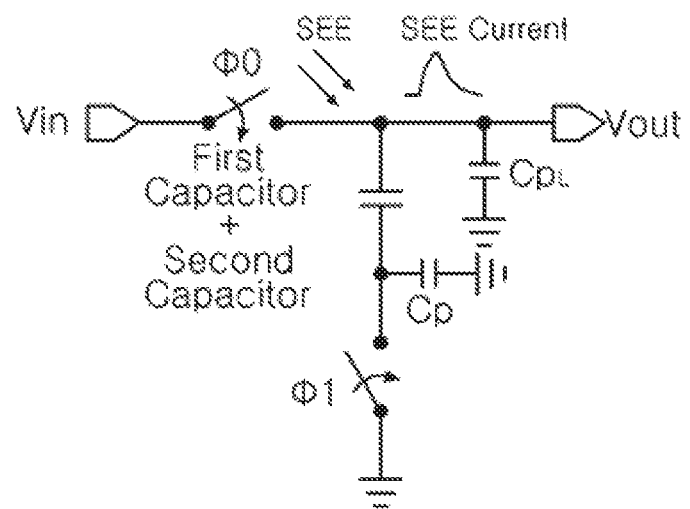
Figure 7B:
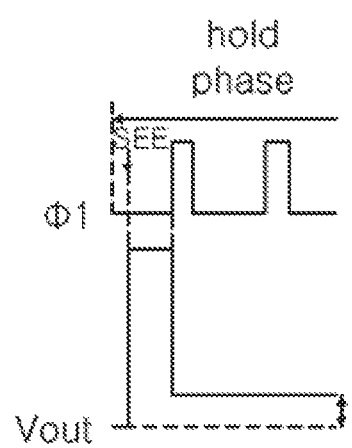

FIGS. 6A to 6B show the results of using two capacitors as in the present disclosure as described above, and FIGS. 7A to 7B show the result of using one capacitor as in the existing technique.

An instantaneous current flows through the output node by the SEE, and the electric charge is charged to the parasitic capacitance $C_{P_L}$.

According to the present disclosure, the output voltage value increased by the SEE is firstly lowered when the second switch 140 is turned on and the second capacitor 120 is connected to ground and then further lowered when the first switch 130 is turned on and the first capacitor 110 is connected to ground.

However, if one capacitor having capacitance equal to the sum of capacitance of two capacitors is used, the difference in output voltage value is increased, compared to the case using two capacitors.

As a result, it may be found that it is more robust to the SEE to use two capacitors, which are halves of one existing capacitor, while controlling their operation timings as in the present disclosure, compared to the case using one capacitor.

As the parasitic capacitance present below the first capacitor 110 and the second capacitor 120 is greater, the effect of the circuit according to the present disclosure may be reduced. However, considering the parasitic capacitance value of a general integrated circuit capacitor (at most 10 to 20% of the original capacitor), it may be found that the present disclosure is more robust to the SEE compared to the case using the existing circuit of FIGS. 7A to 7B.

FIGS. 8 to 11 are diagrams for illustrating a comparator circuit depicted in FIG. 4.

Figure 8:
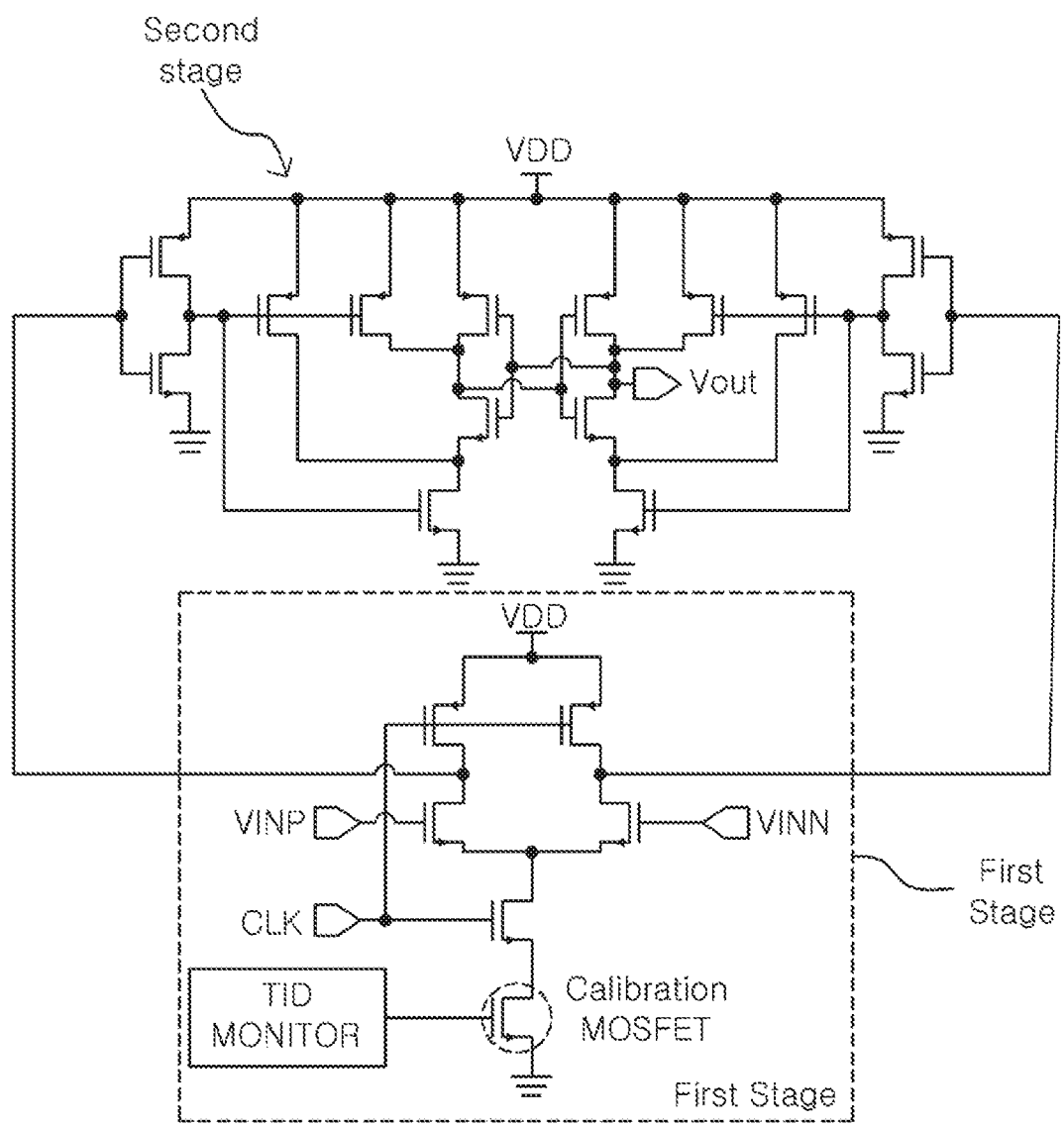
FIGS. 8 to 11 are diagrams for illustrating a comparator circuit depicted in FIG. 4.

Referring to FIG. 8, the comparator circuit 200 includes two stages, namely a first stage and a second stage. The P-channel metal oxide semiconductor (PMOS) connected to the VDD of the first stage turns off (OFF) if the clock is high. In this consideration, the first stage may be modeled as a resistor as shown in FIG. 9.

Figure 9:
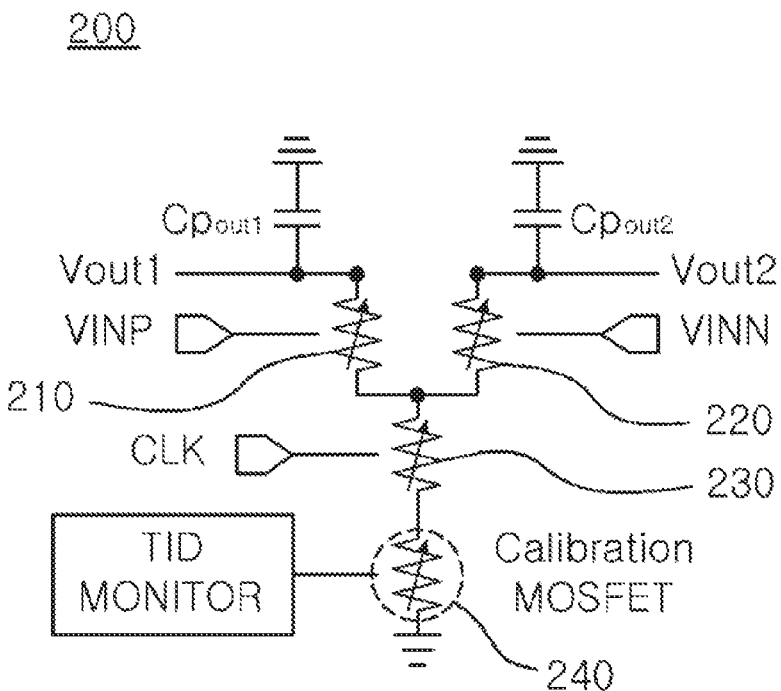

If the clock is high, the N-channel metal oxide semiconductor (NMOS) transistors operating in the triode area may be expressed as a resistor, and the change of each NMOS characteristic by the TID may be modeled as a variable resistor of FIG. 9. Also, $Cp_{out1}$ and $Cp_{out2}$ of FIG. 9 expresses all parasitic capacitances present at every node of $V_{out1}$ and $V_{out2}$ into a single capacitance.

Referring to FIG. 9, the first stage of the comparator circuit 200 includes a first variable resistor 210, a second variable resistor 220, a third variable resistor 230, and a fourth variable resistor 240.

The comparator circuit 200 according to the present disclosure may obtain characteristics robust to the TID by using a digital comparator synchronized to the clock as in FIG. 8, instead of a TID-sensitive analog comparator.

The first variable resistor 210 is connected to the first output voltage ($V_{out1}$) in series and connected to the second variable resistor 220 in parallel to have a parasitic capacitance $Cp_{out1}$ and receive a first differential input signal ($V_{inp}$).

The second variable resistor 220 is connected to the first variable resistor 210 in parallel and connected to the second output voltage ($V_{out2}$) in series to have a parasitic capacitance $Cp_{out2}$ and receive a second differential input signal ($V_{inn}$).

The third variable resistor 230 is connected among the first variable resistor 210, the second variable resistor 220 and the fourth variable resistor 240 in series and receives a clock (CLK) signal.

The fourth variable resistor 240 is connected to the third variable resistor 230 in series and controls a gate voltage through a total ionized dose (TID) monitor.

The fourth variable resistor 240 configured as above calibrates the resistance of the first variable resistor 210, the second variable resistor 220 and the third variable resistor 230 by controlling the gate voltage through the total ionized dose monitor so that the resistance measured at the first output voltage ($V_{out1}$) and the second output voltage ($V_{out2}$) may be maintained consistently.

The transient response at which the output voltage ($V_{out1}$, $V_{out2}$) of the first stage changes according to the clock is determined by the resistance and capacitance at the output. Here, since the resistance is changed due to the TID, the output voltage is also influenced, which changes the performance of the comparator circuit 200.

Thus, the performance of the comparator circuit 200 may be robust to the TID by calibrating the resistance as much as variation through the calibration MOSFET at a lowermost side (namely, the fourth variable resistor 240).

The fourth variable resistor 240 at the lowermost side may calibrate the resistance by adjusting the gate voltage through the total ionized dose (TID) monitor.

Figure 10:
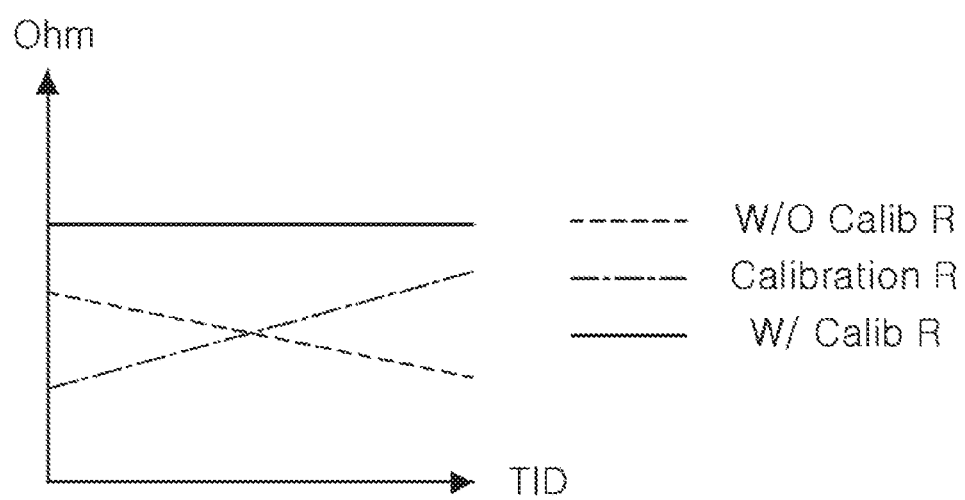

FIG. 10 shows resistances at the first stage output.

Figure 11:
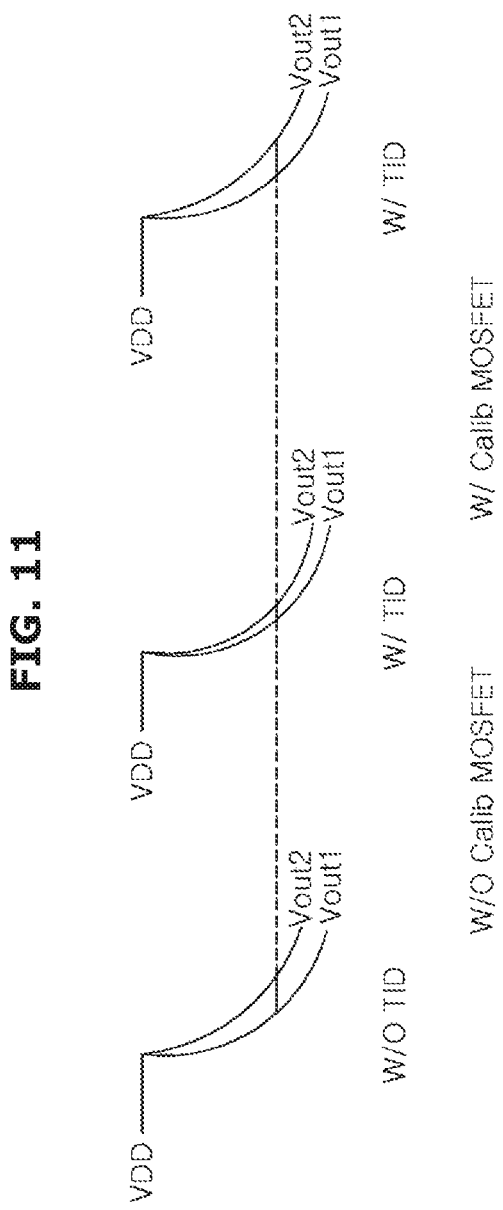

FIG. 11 shows the output voltage values of the first stage when there is no TID effect (a left portion) and when there is a TID effect (a middle portion), and this is a waveform when the first differential input signal ($V_{inp}$) has a higher voltage than the second differential input signal ($V_{inn}$).

When there is a TID effect, the resistances at the $V_{out1}$ and $V_{out2}$ decreases (namely, $V_{th}$ of the NMOS transistor decreases), and thus the voltage is reduced more rapidly. Thus, the difference in time that the input MOSFET of the second stage is turned on is reduced, which gives an adverse influence on the performance of the comparator circuit 200.

However, since the resistance of the first stage output becomes constant by using the fourth variable resistor 240, it is possible to obtain the performance robust to the TID.

In order to increase the difference between $V_{out1}$ and $V_{out2}$ shown in FIG. 11, it is possible to use an input transistor having a great resistance from the first or to design to have great parasitic capacitances $Cp_{out1}$ and $Cp_{out2}$, but they may cause the following problems.

If the voltages of $V_{out1}$ and $V_{out2}$ are reduced too slowly, the difference of time that the input MOSFET of the second stage is turned on is increased, but the time taken for the comparator circuit 200 to compare two inputs and make an output is increased, resulting in a low operation speed.

In addition, the first capacitor 110 may be less affected by the SEE by quickly turning off the first switch 130 of the S/H 100 when the operation of the comparator 200 should run fast.

If the operation speed is low, the first switch 130 should be turned off later, which makes the first capacitor 110 be influenced more by the SEE.

Also, if the operation speed is too low, a comparison operation may not be performed during the compare phase.

Thus, the comparator circuit 200 may have the performance robust to the TID when the resistance of the first stage output is maintained as an optimal value within a certain range that is neither too large nor too small. This may be implemented by using the calibration MOSFET of the present disclosure, namely the fourth variable resistor 240.

Figure 12:
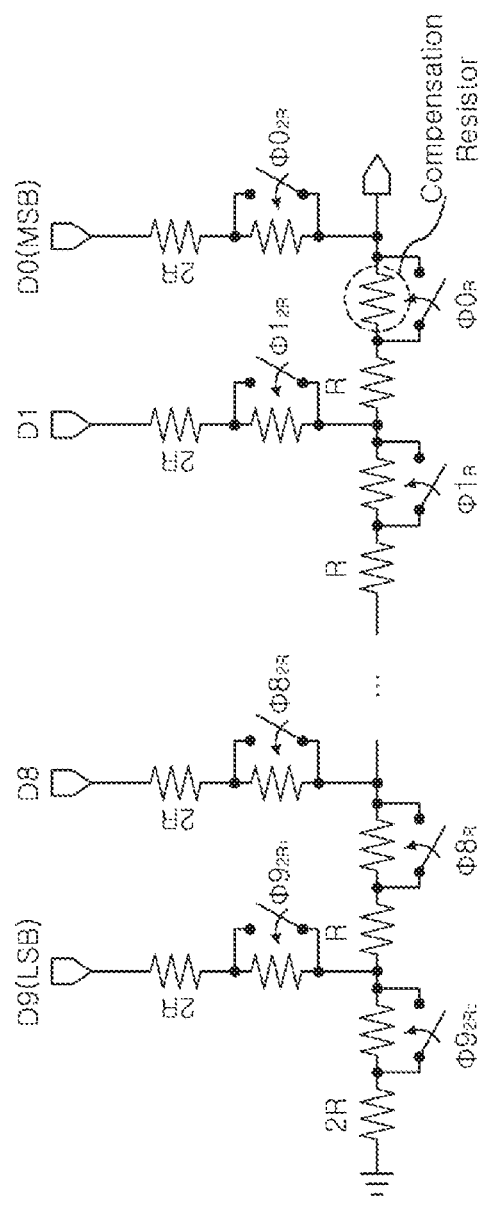
FIGS. 12 and 13 are diagrams for illustrating a resistance-based digital-to-analog converter depicted in FIG. 4.
Figure 13:
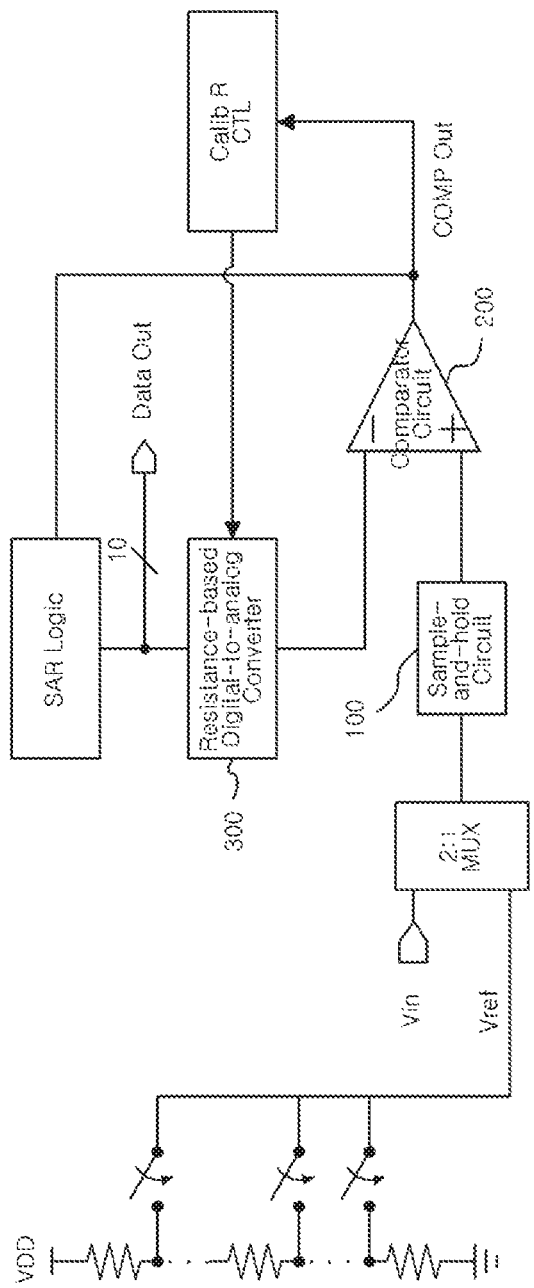

FIGS. 12 and 13 are diagrams for illustrating a resistance-based digital-to-analog converter depicted in FIG. 4.

Referring to FIGS. 12 and 13, the resistance-based digital-to-analog converter 300 converts a capacitor-type DAC structure, which is frequently used in a general SAR ADC, into a resistor-type DAC structure.

If the capacitor-type DAC is used, it may be vulnerable to the SEE due to the switched-capacitor operation.

Thus, by converting the capacitor-type DAC into the resistor-type DAC as shown in FIG. 12, the voltage of each node is caught by a static current, thereby giving a characteristic robust to the SEE.

In addition, by using a calibration resistor, it is possible to calibrate the offset voltage of the comparator circuit 200, which is changed by the TID.

The offset influence of the sample-and-hold circuit 100 and the comparator circuit 200 by the TID is checked through the COMP out of FIG. 13 by applying a predetermined reference voltage to the input.

The offset information checked as above may be calibrated while performing the post processing to the output digital signal of the ADC at the outside, and may also be additionally calibrated through the DAC calibration at the inside of the ADC.

The resistance-based DAC of FIG. 12 makes an artificial offset as much as the offset voltage inside the ADC, which is checked in advance through an additional calibration resistor.

As a result, the same artificial offset voltage made by the resistance-based digital-to-analog converter 300 is applied to the input of the comparator circuit 200, thereby removing the offset caused by the TID.

After the switch of the calibration resistor is adjusted to remove the offset caused by the TID, an original operation is performed by applying an original input voltage again instead of the reference voltage. Because the offset caused by the TID varies over time, the calibration may be performed periodically between ADC operations.

Figure 14:
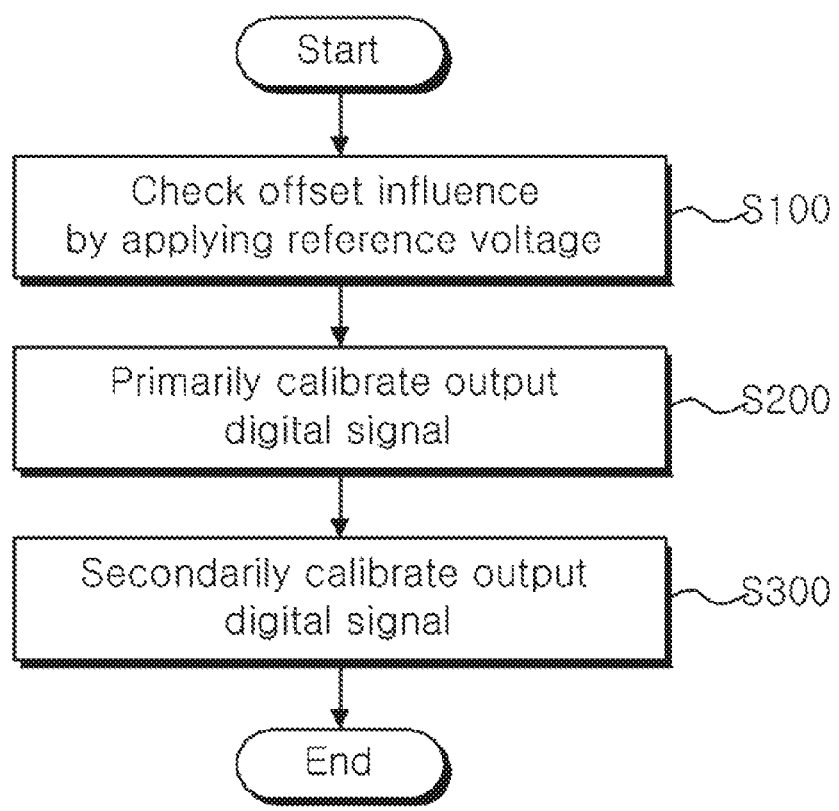
FIG. 14 is a flowchart for illustrating a digital signal calibration method of the radiation-hardened analog-to-digital converter circuit according to an embodiment of the present disclosure.

FIG. 14 is a flowchart for illustrating a digital signal calibration method of the radiation-hardened analog-to-digital converter circuit according to an embodiment of the present disclosure.

Referring to FIG. 14, in the digital signal calibration method of the radiation-hardened analog-to-digital converter circuit, a predetermined reference voltage is applied to the input of the analog-to-digital converter circuit to check an offset influence of the sample-and-hold circuit 100 and the comparator circuit 200 by a total ionized dose (S100).

In S100, the offset influence of the sample-and-hold circuit 100 and the comparator circuit 200 by the TID may be checked through the COMP Out of FIG. 13 by applying the predetermined reference voltage to the input.

The output digital signal of the analog-to-digital converter circuit is primarily calibrated through a post processing at the outside by using the offset influence checked in S100 (S200).

In S200, the offset information obtained in S100 may be primarily calibrated while a post processing is performed to the output digital signal of the ADC at the outside.

The output digital signal primarily calibrated in S200 is secondarily calibrated at the inside of the analog-to-digital converter circuit through DAC calibration at the resistance-based digital-to-analog converter 300 (S300).

In S300, the output digital signal primarily calibrated in S200 may be secondarily calibrated at the inside of the ADC through additional DAC calibration.

In an embodiment, in the secondarily calibrating step (S300), an artificial offset may be made as much as the internal offset voltage of the analog-to-digital converter circuit, which is checked in advance through an additional calibration resistor at the resistance-based analog-to-digital converter 300, so that the offset caused by the total ionized dose may be removed.

The digital signal calibration method of the radiation-hardened analog-to-digital converter circuit having the steps as described above may remove the offset caused by the TID since the same artificial offset voltage made at the resistance-based digital-to-analog converter 300 is applied to the input of the comparator circuit 200.

After the switch of the calibration resistor is adjusted to remove the offset by the TID, the original operation is operated by applying the original input voltage again, instead of the reference voltage.

Since the offset by TID varies over time, the calibration may be performed periodically between ADC operations.

The digital signal calibration method of a radiation-hardened analog-to-digital converter circuit as described above may be implemented in the form of an application or program commands executable by various computer components and be recorded on a computer-readable recording medium. The computer-readable recording medium may include program commands, data files, data structures or the like solely or in combination.

The program commands recorded on the computer-readable recording medium may be specially designed or configured for the present disclosure or known to and available by computer software engineers.

The computer-readable recording medium includes, for example, magnetic media such as a hard disk, a floppy disk and a magnetic tape, optical media such as CD-ROM and DVD, magneto-optical media such as a floptical disk, hardware devices such as ROM, RAM and a flash memory, specially configured to store and perform program commands, or the like.

The program commands include not only machine codes made by a complier but also high-level language codes executable by a computer by using an interpreter. The hardware device may be configured to operate as at least one software module to perform the operations of the present disclosure, or vice versa.

While the present disclosure has been described with reference to the embodiments, it will be understood by those skilled in the art that various changes and modifications can be made without departing from the scope of the present disclosure as set forth in the appended claims.

The present disclosure may be applied to a technique for designing an analog-to-digital converter (ADC) circuit, which is robust to external influences or changes in semiconductor element performance.

Therefore, the present disclosure may be applied to the fields of nuclear power generation markets, space markets and nuclear fusion reactor, which require a stable and effective control system in the presence of radiation, and also the present disclosure may be used as a core technology for a stable and effective control system in the environments in which external influences are applied or the semiconductor element performance is changed.

REFERENCE SIGNS

100: sample-and-hold circuit
110: first capacitor
120: second capacitor
130: first switch
140: second switch
150: third switch
200: comparator circuit
210: first variable resistor
220: second variable resistor
230: third variable resistor
240: fourth variable resistor
300: resistance-based digital-to-analog converter

What is claimed is:

1. A radiation-hardened analog-to-digital converter circuit, comprising:
a sample-and-hold circuit having a plurality of switched-capacitors configured to perform a switching operation corresponding to a sample phase or a hold phase so as to reduce an influence by a single event effect;
a comparator circuit in which a comparator of a first stage is modeled as a variable resistor to compensate for circuit performance that is changed according to a total ionized dose effect, the comparator circuit having a non-inverting input terminal (+ terminal) to which the sample-and-hold circuit is connected; and
a resistance-based digital-to-analog converter connected between an inverting input terminal (− terminal) of the comparator circuit and a successive approximation register logic in series to calculate an offset of the comparator caused by the total ionized dose effect through an external reference voltage and remove the calculated offset through a calibration resistor.

2. The radiation-hardened analog-to-digital converter circuit according to claim 1,
wherein the sample-and-hold circuit includes:
a first capacitor connected to an input ($V_{in}$) and output ($V_{out}$) in parallel;
a second capacitor connected to the input ($V_{in}$), the output ($V_{out}$) and the first capacitor in parallel;
a first switch connected between the first capacitor and the ground in series to perform a switching operation;
a second switch connected between the second capacitor and the ground in series to perform a switching operation; and
a third switch connected between the input ($V_{in}$) and the output ($V_{out}$) in series to perform a switching operation.

3. The radiation-hardened analog-to-digital converter circuit according to claim 2,
wherein in case of a sample phase, the sample-and-hold circuit switches on (ON) the first switch, the second switch and the third switch so that the first capacitor and the second capacitor are charged simultaneously.

4. The radiation-hardened analog-to-digital converter circuit according to claim 2,
wherein in case of a hold phase, the sample-and-hold circuit switches off (OFF) the first switch and the second switch simultaneously so that the first capacitor and the second capacitor come into a floating state, and then switches off the third switch.

5. The radiation-hardened analog-to-digital converter circuit according to claim 4,
wherein in case of the hold phase, the sample-and-hold circuit switches on the second switch before the comparator circuit operates in a compare phase, and then switches off the second switch so that the influence caused by the single event effect generated at the output ($V_{out}$) is compensated.

6. The radiation-hardened analog-to-digital converter circuit according to claim 5,
wherein in case of the hold phase, the sample-and-hold circuit switches on the first switch after switching on and off the second switch so that the influence caused by the single event effect generated at the output ($V_{out}$) is additionally compensated.

7. The radiation-hardened analog-to-digital converter circuit according to claim 1,
wherein the comparator circuit includes:
a first variable resistor connected to a first output voltage ($V_{out1}$) in series to receive a first differential input signal ($V_{inp}$);
a second variable resistor connected to the first variable resistor in parallel and connected to a second output voltage ($V_{out2}$) in series to receive a second differential input signal ($V_{inn}$);
a third variable resistor connected to the first variable resistor and the second variable resistor in series to receive a clock (CLK) signal; and
a fourth variable resistor connected to the third variable resistor in series to control a gate voltage through a total ionized dose (TID) monitor.

8. The radiation-hardened analog-to-digital converter circuit according to claim 7,
wherein the fourth variable resistor compensates for resistances of the first variable resistor, the second variable resistor and the third variable resistor by controlling the gate voltage through the total ionized dose monitor so that the resistances measured at the first output voltage ($V_{out1}$) and the second output voltage ($V_{out2}$) are maintained consistently.

9. A digital signal calibration method of a radiation-hardened analog-to-digital converter circuit, comprising:
checking offset influence of a sample-and-hold circuit and a comparator circuit by a total ionized dose by applying a predetermined reference voltage to an input of an analog-to-digital converter circuit;
primarily calibrating an output digital signal of the analog-to-digital converter circuit through a post processing at the outside by using the checked offset influence; and
secondarily calibrating the primarily calibrated output digital signal at the inside of the analog-to-digital converter circuit through digital-to-analog converter (DAC) calibration at a resistance-based digital-to-analog converter.

10. The digital signal calibration method of a radiation-hardened analog-to-digital converter circuit according to claim 9,
wherein in the secondarily calibrating step, the resistance-based digital-to-analog converter makes an artificial offset as much as an internal offset voltage of the analog-to-digital converter circuit, which is checked in advance through an additional calibration resistor, so that the offset caused by the total ionized dose is removed.

* * * * *